(12) United States Patent
Carlson et al.

(10) Patent No.: US 11,600,614 B2
(45) Date of Patent: Mar. 7, 2023

(54) MICROWAVE INTEGRATED CIRCUITS INCLUDING GALLIUM-NITRIDE DEVICES ON SILICON

(71) Applicant: MACOM Technology Solutions Holdings, Inc., Lowell, MA (US)

(72) Inventors: Douglas Carlson, Lowell, MA (US); Timothy E. Boles, Tyngsboro, MA (US); Wayne Mack Struble, Franklin, MA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 17/213,900

(22) Filed: Mar. 26, 2021

(65) Prior Publication Data

US 2021/0305239 A1 Sep. 30, 2021

Related U.S. Application Data

(60) Provisional application No. 63/000,084, filed on Mar. 26, 2020.

(51) Int. Cl.
*H01L 27/06* (2006.01)
*H01L 21/8258* (2006.01)
(Continued)

(52) U.S. Cl.
CPC .... *H01L 27/0629* (2013.01); *H01L 21/76224* (2013.01); *H01L 21/8258* (2013.01);
(Continued)

(58) Field of Classification Search
CPC . H01L 27/0629; H01L 21/8252; H01L 23/66; H01L 21/6224; H01L 27/0605; H01L 21/84; H01L 21/5268
(Continued)

(56) References Cited

U.S. PATENT DOCUMENTS

| 4,692,998 A | 9/1987 | Armstrong et al. |
| 4,737,236 A | 4/1988 | Perko et al. |

(Continued)

OTHER PUBLICATIONS

International Search Report for Application No. PCT/US2017/027779 dated Nov. 29, 2017.
(Continued)

*Primary Examiner* — Thinh T Nguyen
(74) *Attorney, Agent, or Firm* — Perilla Knox & Hildebrandt LLP; Jason M. Perilla

(57) ABSTRACT

Various integrated circuits formed using gallium nitride and other materials are described. In one example, an integrated circuit includes a first integrated device formed over a first semiconductor structure in a first region of the integrated circuit, a second integrated device formed over a second semiconductor structure in a second region of the integrated circuit, and a passive component formed over a third region of the integrated circuit, between the first region and the second region. The third region comprises an insulating material, which can be glass in some cases. Further, the passive component can be formed over the glass in the third region. The integrated circuit is designed to avoid electromagnetic coupling between the passive component, during operation of the integrated circuit, and interfacial parasitic conductive layers existing in the first and second semiconductor structures, to improve performance.

20 Claims, 8 Drawing Sheets

(51) Int. Cl.
    *H01L 23/66* (2006.01)
    *H01L 21/762* (2006.01)
(52) U.S. Cl.
    CPC .......... *H01L 23/66* (2013.01); *H01L 27/0605* (2013.01); *H01L 2223/6672* (2013.01); *H01L 2223/6683* (2013.01)
(58) Field of Classification Search
    USPC ............................................ 257/76; 438/105
    See application file for complete search history.

(56) References Cited

U.S. PATENT DOCUMENTS

| | | | |
|---|---|---|---|
| 5,268,310 | A | 12/1993 | Goodrich et al. |
| 5,343,070 | A | 8/1994 | Goodrich et al. |
| 5,696,466 | A | 12/1997 | Li |
| 5,877,530 | A | 3/1999 | Aronowitz et al. |
| 5,889,314 | A | 3/1999 | Hirabayashi |
| 5,976,941 | A | 11/1999 | Boles et al. |
| 6,014,064 | A | 1/2000 | Boles et al. |
| 6,114,716 | A | 9/2000 | Boles et al. |
| 6,150,197 | A | 11/2000 | Boles et al. |
| 6,197,645 | B1 | 3/2001 | Michael et al. |
| 6,197,695 | B1 | 3/2001 | Joly et al. |
| 6,329,702 | B1 | 12/2001 | Gresham et al. |
| 6,379,785 | B1 | 4/2002 | Ressler et al. |
| 6,465,289 | B1 | 10/2002 | Streit et al. |
| 6,600,199 | B2 | 7/2003 | Voldman et al. |
| 7,026,223 | B2 | 4/2006 | Goorich et al. |
| 7,071,498 | B2 | 7/2006 | Johnson et al. |
| 7,223,441 | B2 | 5/2007 | Remington, Jr. et al. |
| 7,402,842 | B2 | 7/2008 | Goodrich |
| 7,419,892 | B2 | 9/2008 | Sheppard et al. |
| 7,692,263 | B2 | 4/2010 | Wu et al. |
| 7,709,859 | B2 | 5/2010 | Smith et al. |
| 7,719,091 | B2 | 5/2010 | Brogle |
| 7,745,848 | B1 | 6/2010 | Rajagopal et al. |
| 7,755,173 | B2 | 7/2010 | Mondi et al. |
| 7,858,456 | B2 | 12/2010 | Chiola et al. |
| 7,868,428 | B2 | 1/2011 | Goodrich et al. |
| 8,237,198 | B2 | 8/2012 | Wu et al. |
| 8,390,091 | B2 | 3/2013 | Renaud |
| 8,912,610 | B2 | 12/2014 | Lin et al. |
| 8,946,724 | B1 | 2/2015 | Shinohara et al. |
| 9,111,750 | B2 | 8/2015 | Kashyap et al. |
| 9,142,659 | B2 | 9/2015 | Dora et al. |
| 9,281,417 | B1 | 3/2016 | Lin |
| 9,431,551 | B2 | 8/2016 | Wilhelm |
| 9,515,161 | B1 | 12/2016 | Shinohara et al. |
| 9,559,012 | B1 | 1/2017 | Chu et al. |
| 9,799,760 | B2 | 10/2017 | Green et al. |
| 9,818,856 | B2 | 11/2017 | Hoshi et al. |
| 9,837,521 | B2 | 12/2017 | Yamamoto et al. |
| 9,837,524 | B2 | 12/2017 | Miyake et al. |
| 9,853,108 | B2 | 12/2017 | Kawaguchi |
| 9,893,174 | B2 | 2/2018 | Chowdhury et al. |
| 9,911,817 | B2 | 3/2018 | Xia et al. |
| 9,935,190 | B2 | 4/2018 | Wu et al. |
| 10,416,504 | B2 | 9/2019 | Hatsumi |
| 10,950,598 | B2 * | 3/2021 | Boles et al. ........ H01L 27/0605 |
| 11,056,483 | B2 | 7/2021 | Boles et al. |
| 2002/0139971 | A1 | 10/2002 | Eda |
| 2003/0141518 | A1 | 7/2003 | Yokogawa et al. |
| 2005/0145851 | A1 | 7/2005 | Johnson et al. |
| 2006/0249750 | A1 | 11/2006 | Johnson et al. |
| 2007/0018199 | A1 | 1/2007 | Sheppard et al. |
| 2007/0126067 | A1 | 6/2007 | Hattendorf et al. |
| 2008/0169474 | A1 | 7/2008 | Sheppard |
| 2008/0265379 | A1 | 10/2008 | Brandes et al. |
| 2008/0265739 | A1 | 10/2008 | Yokosawa |
| 2008/0308813 | A1 | 12/2008 | Suh et al. |
| 2009/0026498 | A1 | 1/2009 | Matsuda |
| 2009/0267078 | A1 | 10/2009 | Mishra et al. |
| 2010/0019279 | A1 | 1/2010 | Chen et al. |
| 2010/0117146 | A1 | 5/2010 | Ikeda et al. |
| 2010/0164062 | A1 | 7/2010 | Wang et al. |
| 2011/0049526 | A1 | 3/2011 | Chu et al. |
| 2012/0223320 | A1 | 9/2012 | Dora |
| 2013/0043517 | A1 | 2/2013 | Yin et al. |
| 2014/0103357 | A1 | 4/2014 | Decoutere et al. |
| 2014/0159116 | A1 | 6/2014 | Briere et al. |
| 2014/0231823 | A1 | 8/2014 | Chowdhury et al. |
| 2014/0306235 | A1 | 10/2014 | Decoutere et al. |
| 2015/0034958 | A1 | 2/2015 | Wong et al. |
| 2015/0060876 | A1 | 3/2015 | Xing et al. |
| 2015/0294984 | A1 | 10/2015 | Cheng et al. |
| 2015/0295074 | A1 | 10/2015 | Ozaki et al. |
| 2015/0303291 | A1 | 10/2015 | Makiyama et al. |
| 2016/0086938 | A1 | 3/2016 | Kinzer |
| 2016/0155674 | A1 | 6/2016 | Cho et al. |
| 2016/0190298 | A1 | 6/2016 | Wu et al. |
| 2016/0233235 | A1 | 8/2016 | Miyairi et al. |
| 2016/0351092 | A1 | 12/2016 | Chen et al. |
| 2017/0133500 | A1 | 5/2017 | Etou et al. |
| 2017/0301780 | A1 | 10/2017 | Boles et al. |
| 2017/0301781 | A1 | 10/2017 | Boles et al. |
| 2017/0301798 | A1 | 10/2017 | Kaleta et al. |
| 2017/0301799 | A1 | 10/2017 | Boles et al. |
| 2017/0317202 | A1 | 11/2017 | Green et al. |
| 2017/0338171 | A1 | 11/2017 | Cho et al. |
| 2017/0345812 | A1 | 11/2017 | Chou et al. |
| 2018/0175268 | A1 | 6/2018 | Moon et al. |
| 2018/0248009 | A1 | 8/2018 | Wong et al. |
| 2018/0295683 | A1 | 10/2018 | Tung et al. |
| 2019/0229114 | A1 * | 7/2019 | Boles et al. ........ H01L 27/0605 |
| 2019/0229115 | A1 | 7/2019 | Boles et al. |
| 2019/0341480 | A1 | 11/2019 | Boles et al. |
| 2021/0327886 | A1 * | 10/2021 | Roig-guitart et al. ...................... H01L 27/112 |

OTHER PUBLICATIONS

Written Opinion of the ISA for Application No. PCT/US2017/027779 dated May 8, 2018.
Ch. II International Preliminary Report on Patentability for International Application No. PCT/US2017/027779, dated Aug. 9, 2018.
International Search Report for Application No. PCT/US2017/027780 dated Dec. 21, 2017.
Written Opinion of the ISA for Application No. PCT/US2017/027780 dated May 30, 2018.
Ch. II International Preliminary Report on Patentability for International Application No. PCT/US2017/027780, dated Jul. 24, 2018.
Fangsheng et al., AlGaN/GaN Mis HEMT with AlN Dielectric. GaAs Mantech Conf Proc. 2006: 227-30.
Tsou et al., 2.07-kV AlGaN/GaN Schottky Barrier Diodes on Silicon With High Baliga's Figure-of-Merit. IEEE Electron Device Letters. Jan. 2016;37(1):70-3.
International Search Report and Written Opinion for PCT/US2021/024375 dated Jun. 17, 2021.
Non-Final Office Action for U.S. Appl. No. 17/344,057 dated Sep. 22, 2022.
Non-Final Office Action for U.S. Appl. No. 17/181,613 dated Sep. 23, 2022.

* cited by examiner

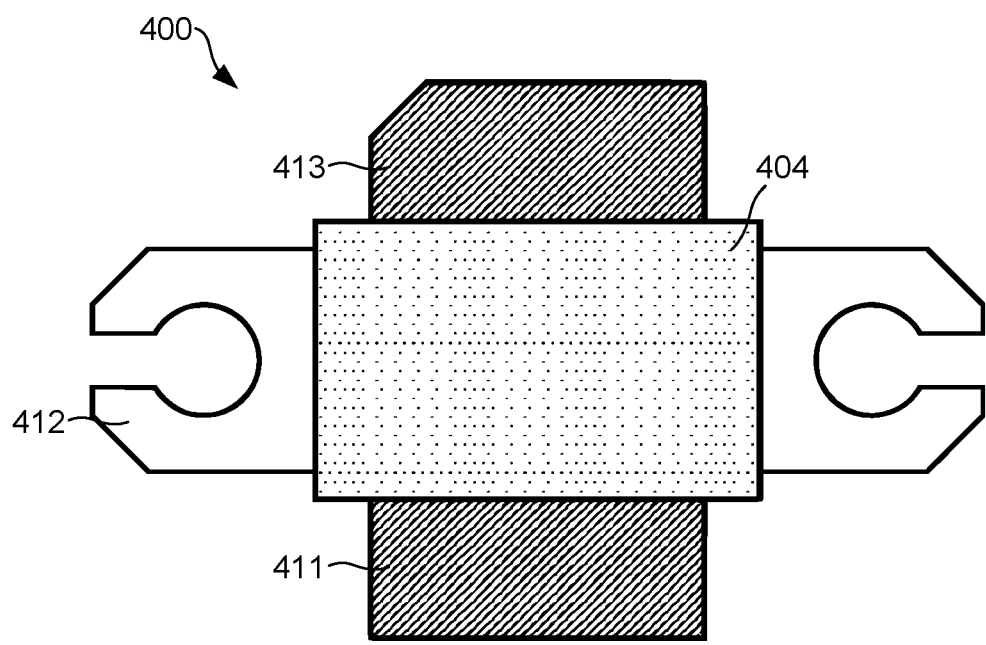
FIG. 4A
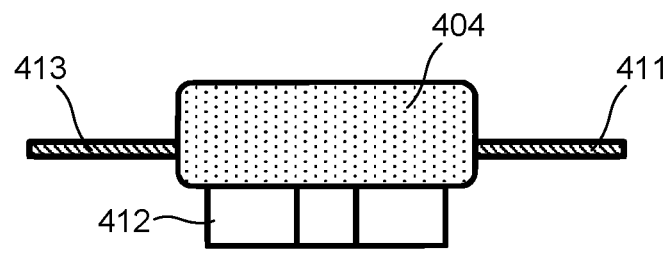
FIG. 4-B

MICROWAVE INTEGRATED CIRCUITS INCLUDING GALLIUM-NITRIDE DEVICES ON SILICON

CROSS-REFERENCE TO RELATED APPLICATIONS

This application claims the benefit of priority to U.S. Provisional Ser. Application No. 63/000,084, filed Mar. 26, 2020, titled "Heterolithic Microwave Integrated Circuits including Gallium-Nitride devices on Silicon," the entire contents of which is hereby incorporated herein by reference.

BACKGROUND

The semiconductor industry continues to see demands for integrated circuits and devices having lower cost and size, particularly for monolithic microwave integrated circuit (MMIC) devices. MMIC devices encompass integrated circuits (IC) designed for operation over microwave frequencies. MMIC devices can be relied upon for power amplification, mixing, and high-frequency switching, among other operations. The semiconductor industry also continues to see demands for higher voltage and higher power integrated devices, including high voltage and high power MMIC power amplifiers.

In the context of integrated circuits, high-speed power amplifier circuits have a variety of useful applications, such as in radio-frequency (RF) communications, radar, RF power, and microwave applications. Such circuits can include transistors, diodes, and other active devices formed from semiconductor materials, along with a number of other passive circuit components, including resistors, capacitors, inductors, and interconnects. Beyond silicon, gallium nitride semiconductor material has received strong attention for the implementation of active devices, because of its desirable properties and characteristics.

SUMMARY

Various integrated circuits formed using gallium nitride and other materials are described. In one example, an integrated circuit includes a first integrated device formed over a first semiconductor structure in a first region of the integrated circuit, a second integrated device formed over a second semiconductor structure in a second region of the integrated circuit, and a passive component formed over a third region of the integrated circuit, between the first region and the second region. The third region can include an insulating material, such as glass. The passive component can be formed over the glass in the third region.

In other aspects, the passive component can include a network of passive components, and the network of passive components can include at least one capacitor and at least one inductor, among possibly other passive components. The passive components can be a network of passive components for input and output impedance matching of the integrated circuit.

In other aspects, the first semiconductor structure can include an island of gallium nitride material formed over a semiconductor substrate, and the first integrated device can be formed in the island of gallium nitride material. In the third region, the insulating material can extend down into the semiconductor substrate to at least a distance below an interface between the island of gallium nitride material and the semiconductor substrate in the first region. In that way, an undesirable interfacial parasitic conductive layer, particularly near the top surface of the semiconductor substrate at the interface, can be physically and structurally interrupted by the insulating material. In some cases, the insulating material can separate the first semiconductor structure from the second semiconductor structure in the third region.

In other aspects, the second semiconductor structure can include an island of gallium nitride material formed over the semiconductor substrate, and the second integrated device can be formed in the island of gallium nitride material. Alternatively, the second semiconductor structure can include an island of silicon over the semiconductor substrate, and the second integrated device can be formed in the island of silicon.

In other aspects, the first integrated device and the second integrated device can be embodied as high-electron-mobility transistors. In other cases, the first integrated device can be a transistor, and the second integrated device can be a diode. The integrated circuit can also include a ground plane formed on a back side of the integrated circuit, below the first semiconductor structure and the second semiconductor structure. The integrated circuit can also include a passivation layer formed over the first integrated device, the second integrated device, and the passive component. The integrated circuit can also include a semiconductor pedestal in the third region, wherein the passive component is electrically coupled to the ground plane through an interconnect supported along at least one surface of the semiconductor pedestal. The semiconductor pedestal can be separated from the first semiconductor structure by the insulating material, and the semiconductor pedestal can also be separated from the second semiconductor structure by the insulating material.

In other embodiments, a method of forming an integrated circuit is also described. The method includes forming a first integrated device over a first semiconductor structure in a first region of the integrated circuit, forming a second integrated device over a second semiconductor structure in a second region of the integrated circuit, etching a cavity in a third region of the of the integrated circuit located between the first region and the second region, filling the cavity with an insulating material, and forming a passive component over the insulating material in the third region of the integrated circuit. The third region can include an insulating material, such as glass. The passive component can be formed over the glass in the third region.

In other aspects, the passive component can include a network of passive components, and the network of passive components can include at least one capacitor and at least one inductor, among possibly other passive components. The passive components can be a network of passive components for input and output impedance matching of the integrated circuit.

In other aspects, the first semiconductor structure can include an island of gallium nitride material formed over a semiconductor substrate, and the first integrated device can be formed in the island of gallium nitride material. In the third region, the insulating material can extend down into the semiconductor substrate to at least a distance below an interface between the island of gallium nitride material and the semiconductor substrate in the first region. In that way, an undesirable interfacial parasitic conductive layer, particularly near the top surface of the semiconductor substrate at the interface, can be physically and structurally interrupted by the insulating material. In some cases, the insulating material can separate the first semiconductor structure from the second semiconductor structure in the third region.

In other aspects, the first integrated device and the second integrated device can be embodied as high-electron-mobility transistors. In other cases, the first integrated device can be a transistor, and the second integrated device can be a diode. The integrated circuit can also include a ground plane formed on a back side of the integrated circuit, below the first semiconductor structure and the second semiconductor structure.

BRIEF DESCRIPTION OF THE DRAWINGS

The present disclosure can be better understood with reference to the following drawings. It is noted that the elements in the drawings are not necessarily drawn to scale, with emphasis instead being placed upon illustrating the principles of the examples. The drawings are representative and provided as an example to convey the concepts described herein. Where the drawings relate to microfabricated circuits, only one device and/or circuit may be shown to simplify the drawings. In practice, a large number of devices or circuits may be fabricated in parallel across a larger area of a substrate or entire substrate. Additionally, a depicted device or circuit may be integrated within a larger circuit. In the drawings, like reference numerals designate like or corresponding, but not necessarily the same, elements throughout the several views.

FIG. 3-1 illustrates an example structure and patterned resist associated with a method of manufacturing an integrated circuit according to various examples described herein.

FIG. 3-2 illustrates an example structure after etching semiconductor material according to various examples described herein.

FIG. 3-3 illustrates an example structure associated with further patterned etching of a base semiconductor according to various examples described herein.

FIG. 3-4 illustrates an example structure after deposition and patterning of layers of material according to various examples described herein.

FIG. 3-5 illustrates an example application of an electrically-insulating material to fill cavities etched into a substrate according to various examples described herein.

FIG. 3-6 illustrates an example after the application of the electrically-insulating material according to various examples described herein.

FIG. 3-7 illustrates the removal of a top of the electrically-insulating material according to various examples described herein.

FIG. 3-8 illustrates the patterned etching of the electrically-insulating material according to various examples described herein.

FIG. 3-9 illustrates an example of forming active devices and passive components according to various examples described herein.

FIG. 3-10 illustrates a structure that results after application of a passivating layer according to various examples described herein.

FIG. 3-11 illustrates a resulting integrated circuit after removing a portion of the base semiconductor substrate according to various examples described herein.

FIG. 4A illustrates a plan view of an example package for a semiconductor die including an integrated circuit according to various examples described herein.

FIG. 4B illustrates an elevation view of the example package shown in FIG. 4A according to various examples described herein.

DETAILED DESCRIPTION

Figure 1:
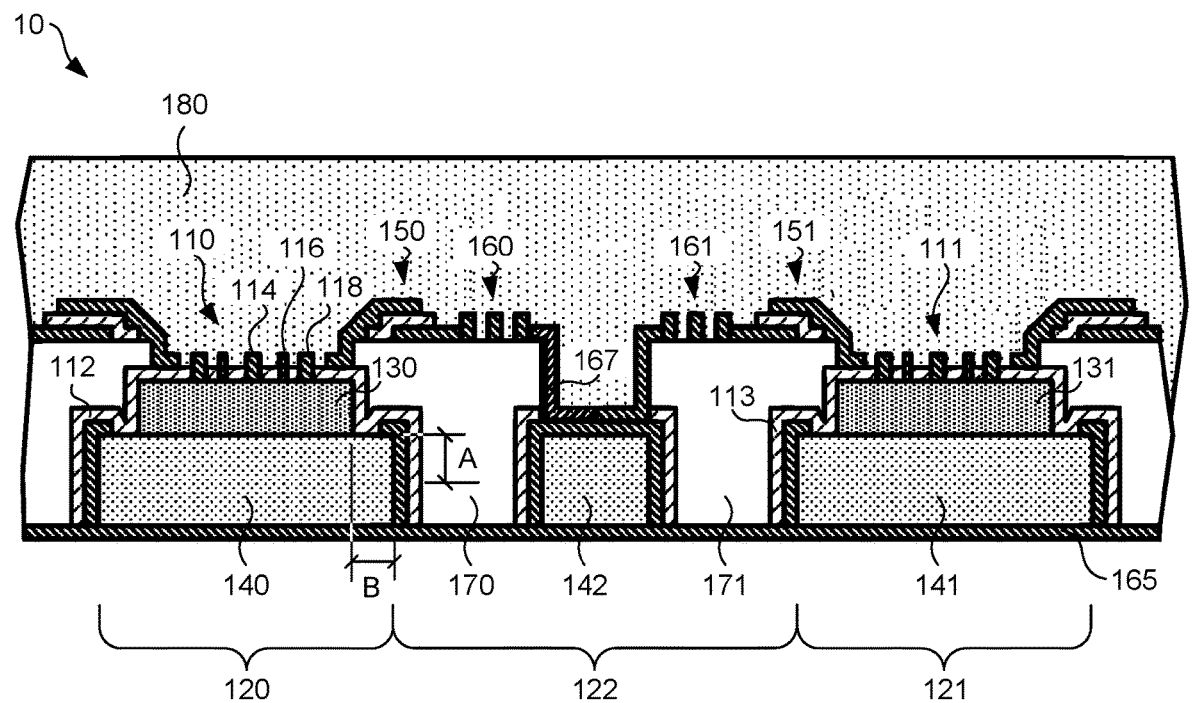
FIG. 1 illustrates a portion of an example integrated circuit according to various examples described herein.

Radio-frequency (RF) wireless communications, among other applications, can place significant performance demands on high-speed amplifiers and related integrated circuits, including semiconductor transistors, diodes, and other RF circuit elements. For example, amplifiers may need to meet performance specifications related to output power, signal linearity, signal gain, bandwidth, and efficiency. Meeting these demands can also place tight performance constraints on components of the integrated circuits, such as passive components used for input and output impedance matching networks and signal switching.

RF integrated circuits often include other components or elements in addition to active devices, such as resistors, capacitors, inductors, interconnects, antennas, signal couplers, power splitters, and microstrip transmission lines. It can be desirable to integrate some or all of these components onto a monolithic microwave integrated circuit (MMIC) for some RF applications.

It can be relatively difficult in some cases, however, to reduce or eliminate parasitic conductance in some semiconductor substrates or structures used for integrated circuit devices. For example, gallium nitride material formed on silicon and high-resistivity silicon (and other group III-V materials formed on intrinsic silicon or other bulk intrinsic semiconductors) may exhibit an undesirable interfacial parasitic conductive layer. Passive components, such as capacitors, inductors, transmission lines, and other components that are formed over this conductive layer can generate electromagnetic fields during operation. The electromagnetic fields oscillate at RF frequencies and can drive currents in the parasitic conductive layer. Such currents can lead to integrated circuit losses and reduce the efficiency of networks and circuits containing such components.

According to aspects of the embodiments, passive components and networks containing such passive components can be formed over regions of insulating material in an integrated circuit. The insulating material can mitigate or eliminate the effects that would otherwise occur if the components were located over and closer to a conducting layer, including a parasitic conductive layer. A number of different regions of insulating material can be formed between semiconductor structures on which active devices (e.g., transistors, diodes, diodes, etc.) are formed.

In one example, an integrated circuit includes a first integrated device formed over a first semiconductor structure in a first region of the integrated circuit, a second integrated device formed over a second semiconductor structure in a second region of the integrated circuit, and a passive component formed over a third region of the integrated circuit, between the first region and the second region. The third region comprises an insulating material, which can be glass in some cases. Further, the passive component can be formed over the glass in the third region. The integrated circuit is designed to avoid electromagnetic coupling between the passive component, during operation of the integrated circuit, and interfacial parasitic conductive layers existing in the first and second semiconductor structures, to improve performance.

Turning to the drawings, FIG. 1 illustrates a portion of an example integrated circuit 10 according to various examples described herein. The integrated circuit 10 is presented as a representative example to discuss certain advantages of the embodiments described herein. The illustration in FIG. 1 is not exhaustive, and the integrated circuit 10 can include other components and structural features that are not shown. Additionally, one or more of the components shown in FIG. 1 can be omitted in some cases. The integrated circuit 10 can be packaged in a suitable semiconductor package, with or without other components, as described in further detail below with reference to FIGS. 4A and 4B.

The integrated circuit 10 can be embodied as a monolithic microwave integrated circuit (MMIC). The integrated circuit 10 can be relied upon for power amplification, low-noise amplification, mixing, high-frequency switching, and other applications, typically at high frequencies in the microwave range. The integrated circuit 10 can also be embodied as a heterolithic microwave integrated circuit (HMIC) in some cases. When embodied as an HMIC, the integrated circuit 10 can incorporate a number of different types of materials, such as glass and silicon, into a single monolithic structure. The integrated circuit 10 can thus leverage the respective properties of those materials, among others, to achieve better performance characteristics in a small, high performance microwave integrated circuit. The integrated circuit 10 can also be formed using automated batch process fabrication, to accelerate the manufacture of many integrated circuits similar to the integrated circuit 10 on a single semiconductor substrate.

As shown in FIG. 1, the integrated circuit 10 includes a first integrated active semiconductor device 110 and a second integrated active semiconductor device 111. The first active semiconductor device 110 is a field-effect transistor, and the second active semiconductor device 111 is also field-effect transistor in the example shown. Thus, the device 110 can have one or more drain contacts 114, one or more gate contacts 116, and one or more source contacts 118, although the contacts can be rearranged as compared to that designated and shown in FIG. 1. The device 111 can also have one or more drain, gate, and source contacts, as would be understood in the field.

In one example, the devices 110 and 111 can be embodied as high-electron-mobility transistors (HEMTs). The devices 110 and 111 can be embodied as other types of active devices, however, such as junction field-effect transistors, bipolar junction transistors, insulated-gate bipolar transistors, diodes (e.g., photodiodes, Schottky diodes, and light-emitting and laser diodes, etc.), and other devices. In other examples, both the devices 110 and 111 can be embodied as diodes. In other examples, the devices 110 and 111 can be embodied as two different types of devices, such as one transistor and one diode, and other combinations are within the scope of the embodiments.

The device 110 is formed in a first region 120 of the integrated circuit 10, and the device 111 is formed in a second region 121 of the integrated circuit 10. The first region 120 and the second region 121 are active regions of the integrated circuit 10. More than one active device can be formed in each of the first region 120 and the second region 121, in some cases, although one active device is shown in each region in FIG. 1. The integrated circuit 10 also includes a third region 122 between the first region 120 and the second region 121, which is further described below.

The first device 110 is formed in a first semiconductor island 130, which is formed over a first semiconductor mesa 140 in the first region 120. The second device 111 is formed in a second semiconductor island 131, which is formed over a second semiconductor mesa 141 in the second region 121. Together, the first semiconductor island 130 and the first semiconductor mesa 140 can be referred to as a first semiconductor structure on which the first device 110 is formed. Similarly, the second semiconductor island 131 and the second semiconductor mesa 141 can be referred to as a second semiconductor structure on which the second device 110 is formed.

A semiconductor pedestal 142 is present in the third region 122. The semiconductor pedestal 142 provides a structure upon which electrical interconnects or other features of the integrated circuit 10 can be formed, as described below. The semiconductor pedestal 142 can be omitted from the third region 122 in some cases. In other cases, the third region 122 can include one or more semiconductor pedestals in addition to the semiconductor pedestal 142.

The integrated circuit 10 also includes a number of passive components formed in the third region 122. In the example shown, the integrated circuit 10 includes a first capacitor 150, a second capacitor 151, a first inductor 160, and a second inductor 161 formed in the third region 122. As one example, the capacitors 150 and 151 can be formed as metal-insulator-metal (MIM) capacitors, with a first or bottom metal layer, a dielectric layer over the bottom metal layer, and a second or top metal layer over the dielectric layer. The dielectric layer can be silicon nitride ($Si_3N_4$), silicon dioxide, tantalum pentoxide ($Ta_2O_5$), silicon oxynitride ($SiO_xN_y$), or other suitable dielectric materials. The capacitors 150 and 151 can also be formed using other suitable structures and materials.

The inductors 160 and 161 can be formed using patterned metal traces of suitable shapes and sizes (i.e., lengths, widths, turns, etc.). The integrated circuit 10 can also include other passive components, such as resistors, interconnects, antennas, signal couplers, power splitters, microstrip transmission lines, and other components formed in the region 122. In some cases, passive components can also be formed, or formed in part, over one or both of the regions 120 and 121, although it is preferable to form the passive components over (or entirely over) the region 122 according to the concepts.

The first capacitor 150 is electrically coupled between the active device 110 (e.g., at the drain, source, or gate of the active device 110) and the first inductor 160. The first inductor 160 is electrically coupled between the capacitor 150 and a ground plane 165 formed on a bottom surface of the integrated circuit 10. Metal interconnects can be used to electrically couple the active device 110 to the capacitor 150, to electrically couple the capacitor 150 to the inductor 160, and to electrically couple the inductor 160 to the ground plane 165, as further described below. The integrated circuit 10 include any number of conductive, metal interconnects between components. Metal interconnects can also be used to electrically couple the active device 111 to the capacitor 151, to electrically couple the capacitor 151 to the inductor 161, and to electrically couple the inductor 161 to the ground plane 165. The metal interconnects can extend in two or three different dimensions or directions, over the topography on a process side of the integrated circuit 10, and to a depth into the integrated circuit 10. In some cases, the metal interconnects can extend from a process side of the integrated circuit 10, into the integrated circuit 10, to the ground plane 165.

One example metal interconnect 167 is identified in FIG. 1, which runs between the inductor 160 and the ground plane 165. Thus, the inductor 160 is electrically coupled to the ground plane 165 through the metal interconnect 167, which is supported in part along an outer surface of the insulating material 170. The metal interconnect 167 is also supported in part along the semiconductor pedestal 142, as shown in FIG. 1. Other metal interconnects can be supported along other sides or surfaces in the integrated circuit 10.

As shown in FIG. 1, the ground plane 165 is formed on a backside of the integrated circuit 10. The ground plane 165 can include one or more layers of metal deposited on the back or bottom surface of the base semiconductor substrate (e.g., the base semiconductor substrate 300 shown in FIG. 3-1) used to form the semiconductor mesas 140 and 141. The ground plane 165 can be lithographically patterned in any suitable pattern, and can be electrically coupled to a reference potential, such as ground for the integrated circuit 10. The ground plane 165 can also be used for mounting the integrated circuit 10 in a device package or other receiving substrate. For example, the integrated circuit 10 can be adhered to a receiving substrate, a metallic slug in a device package, or other surface using a solder bond with the ground plane 165, which can provide a low-loss electrical connection. In some cases, the integrated circuit 10 can be adhered to a receiving substrate using a thermally-conductive adhesive or electrically and thermally-conductive bond with the ground plane 165. The ground plane 165 can provide improved thermal conductivity of heat from the active devices 110 and 111 to a backside of the integrated circuit 10, where the heat can be exchanged to a receiving substrate, metallic slug, or other sink to which the integrated circuit 10 is bonded.

In the integrated circuit 10, the active devices 110 and 111 can be components of a larger integrated circuit. For example, the active devices 110 and 111 can be devices in a Doherty amplifier. The active devices 110 and 111 can also be components in other types of amplifiers and circuits. The passive components, including the capacitors 150 and 151 and the inductors 160 and 161 can also be components in a larger circuit. For example, the capacitors 150 and 151 and the inductors 160 and 161 can be part of an impedance-matching, impedance-transforming, or phase-delay network that is located between the active devices 110 and 111, among others.

The integrated circuit 10 also includes dielectric films 112 and 113 formed, respectively, around the device 110 and the device 111, and a passivation layer 180. The passivation layer 180 can be formed using a polymer, such as but not limited to polyimide or benzocyclobutene. In other cases, the passivation layer 180 can include an inorganic passivation layer, such as but not limited to an oxide or nitride.

The active devices 110 and 111 can be formed on semiconductor structures including a base of silicon and a layer of gallium nitride material in one example. In that case, the first semiconductor island 130 and the second semiconductor island 131 can be formed as a layer of gallium nitride material, and the active devices 110 and 111 can be formed in or on the layer of gallium nitride material. The gallium nitride material can be formed by epitaxial growth, although other techniques can be relied upon. Thus, the semiconductor islands 130 and 131 can be epitaxially grown directly on a base semiconductor substrate, which ultimately forms the semiconductor mesas 140 and 141, as described below with reference to FIGS. 3-2 and 3-3. Additionally, one or more diffusion, doping, insulating, metal, and other layers or regions can be formed near or on the top surface of the semiconductor islands 130 and 131 during any number of lithographic and microfabrication process steps, to form the active devices 110 and 111.

According to some embodiments, the semiconductor islands 130 and 131 can be formed using the processes described in U.S. Pat. No. 9,627,473, titled "Parasitic Channel Mitigation in III-nitride Material Semiconductor Structures," the entire contents of which is hereby incorporated herein by reference. Additional processes that can be relied upon to form the semiconductor islands 130 and 131 are also described in U.S. Pat. No. 7,135,720, titled "Gallium Nitride Material Transistors and Methods Associated with the Same," and in U.S. Pat. No. 9,064,775, titled "Gallium Nitride Semiconductor Structures with Compositionally-Graded Transition Layer," the entire contents of both of which are hereby incorporated herein by reference. In embodiments, the active devices 110 and 111 can be formed using the processes described in U.S. patent application Ser. No. 15/223,734, titled "High-Voltage GaN High Electron Mobility Transistors with Reduced Leakage Current," the entire contents of which is also hereby incorporated herein by reference.

Figures 1, 3:
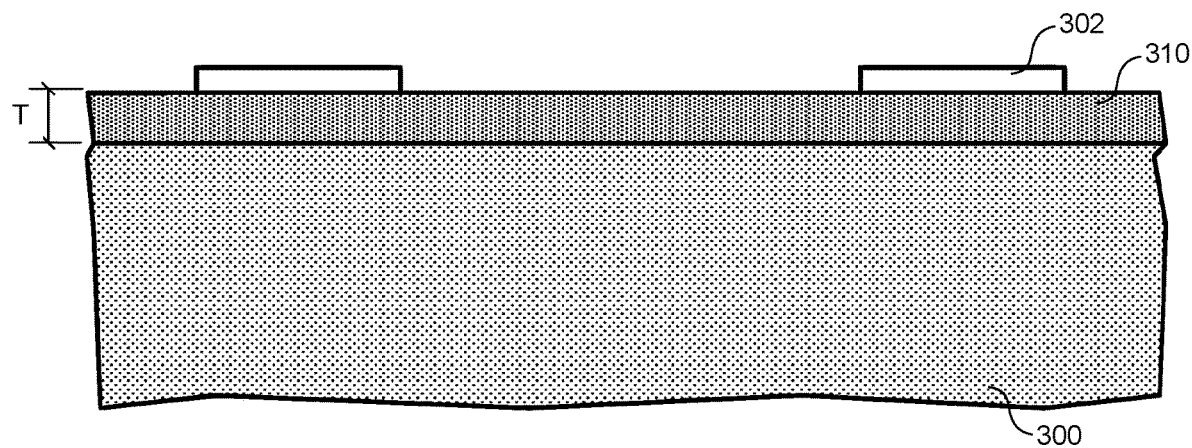
Figures 2, 3:
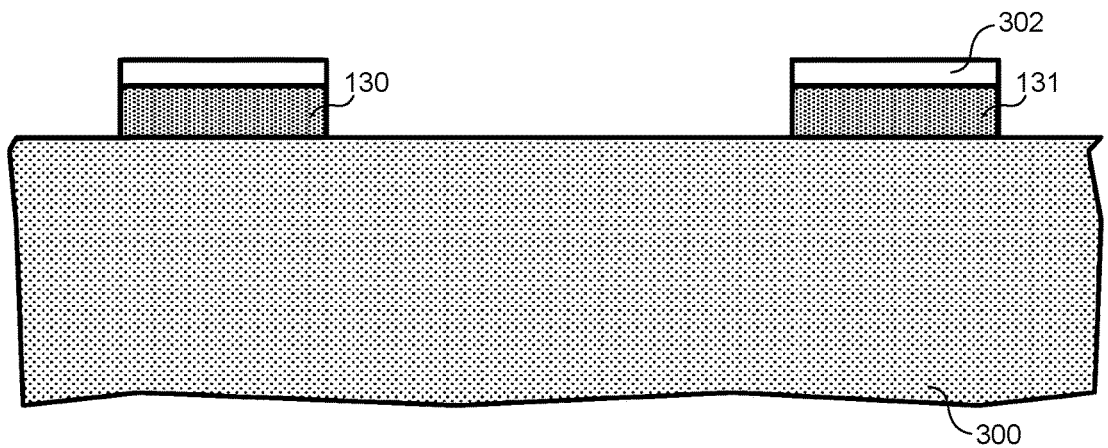
Figure 3:
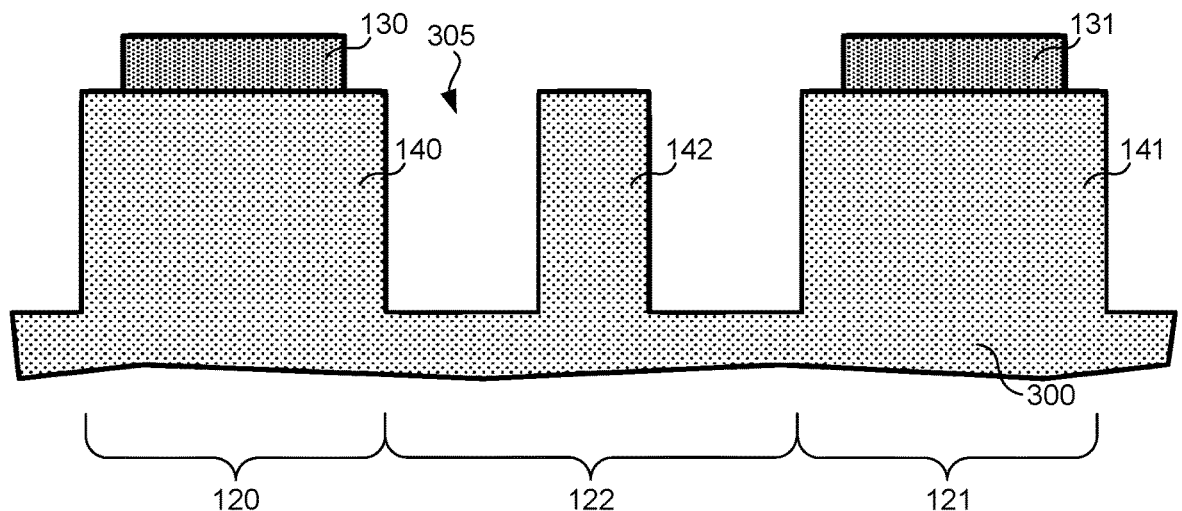

The first semiconductor mesa 140 and the second semiconductor mesa 141 can be embodied as respective portions or regions of a base semiconductor substrate (e.g., the base semiconductor substrate 300 shown in FIG. 3-1). Areas of the semiconductor substrate can be removed during certain processing steps described below, and the remaining portions of the semiconductor substrate can form the first semiconductor mesa 140 and the second semiconductor mesa 141, among possibly others. Remaining portions of the semiconductor substrate also form the semiconductor pedestal 142. Although not shown in FIG. 1, there can be one or more buffer layers, transition layers, diffusion barrier layers, and other layers located between the semiconductor mesas 140 and 141 and the semiconductor islands 130 and 131 in the regions 120 and 121.

The base semiconductor substrate used to form the semiconductor mesas 140 and 141 can be a highly-doped silicon substrate in one example. In some cases, forming the active devices 110 and 111 on highly-doped silicon (e.g., with a doping density of at least $5\times10^{18}$ cm$^{-3}$) can mitigate the effects associated with parasitic conductance and parasitic currents that could otherwise occur in a lightly doped and more resistive semiconductor material underlying the active devices 110 and 111. The resistivity of the base semiconductor substrate on which the semiconductor islands 130 and 131 are formed can be between 0.0001 ohm-cm and 0.010 ohm-cm. In some cases, the resistivity of the base semiconductor substrate can be between 0.0001 ohm-cm and 0.005 ohm-cm.

The semiconductor islands 130 and 131 can also include a gallium nitride buffer layer, to obtain semiconductor devices with very high reverse-bias breakdown voltages. Schottky diodes and HEMTs formed with such buffer layers are described in U.S. patent application Ser. No. 15/223,734, referenced above, and can sustain reverse bias voltages as high as 2000 volts, exhibit low leakage currents (e.g., not more than 40 microamps per millimeter of transistor gate width), and handle large forward currents (e.g., as much as 1 amp per millimeter of gate width).

In some cases, the device 110 can be formed from one or more layers of semiconductor material that are different than those used to form the device 111. For example, the first semiconductor island 130 can include a layer of gallium nitride material, and the second semiconductor island 131 can include a layer of silicon. Other examples of two active devices formed in different types of semiconductor materials in the same monolithic integrated circuit are described in U.S. Patent Application Publication No. 2019-0229114, titled "Heterolithic Microwave Integrated Circuits including Gallium-Nitride devices on Intrinsic Semiconductor," and in U.S. Pat. No. 10,950,598, titled "Heterolithic Microwave Integrated Circuits including Gallium-Nitride devices on Highly Doped Semiconductor," the entire contents of both of which are hereby incorporated herein by reference.

When the semiconductor islands 130 and 131 of gallium nitride material (or other group III-V materials) are formed on the semiconductor mesas 140 and 141 of bulk, intrinsic, or high-resistivity silicon, the resulting semiconductor structure can exhibit an undesirable interfacial parasitic conductive layer, particularly near the top surface region of the semiconductor mesas 140 and 141. Passive components, such as capacitors, inductors, transmission lines, and other components that are formed over this conductive layer can generate electromagnetic fields during operation. The electromagnetic fields oscillate at RF frequencies and can drive currents in the parasitic conductive layer. Such currents can lead to efficiency losses and other drawbacks in the integrated circuit 10.

To help address those drawbacks, the integrated circuit 10 also includes relatively thick areas of insulating material. The insulating material is formed in the region 122 between the active devices 110 and 111. Example areas of insulating material 170 and insulating material 171, among others, are shown in FIG. 1. The insulating material 170 is formed between the device 110 and the semiconductor pedestal 142. The insulating material 171 is formed between the device 111 and the semiconductor pedestal 142. Passive components, including the capacitors 150 and 151 and the inductors 160 and 161, can be formed over the insulating materials 170 and 171, and the insulating materials 170 and 171 can provide a physical foundation or support for those components.

In one example, the insulating materials 170 and 171 may extend from or nearly from (e.g., within about 10 micron (μm) from) the ground plane 165 of the integrated circuit 10, to a process side of the integrated circuit 10 where the devices 110 and 111 are formed. In that case, the insulating materials 170 and 171 can separate (or nearly separate) the semiconductor mesas 140 and 141 and the semiconductor pedestal 142 (i.e., at least in the cross-section shown in FIG. 1) from each other.

The insulating materials 170 and 171 may not extend all the way to or contact the ground plane 165 in other cases. In that case, the semiconductor mesas 140 and 141 and the semiconductor pedestal 142 can remain connected as a single, continuous semiconductor substrate. However, the insulating material 170 can still extend down into the semiconductor substrate in the region 122, but only to the distance "A" below the interface between the island 130 and mesa 140. Similarly, the insulating material 171 can still extend down into the semiconductor substrate, but only to the distance "A." The distance "A" can be selected to be large enough to break or interrupt the parasitic conductive layer, particularly near the top surface region of the semiconductor mesas 140 and 141. In one example, the distance "A" can be at least 5 μm. In another example, the distance "A" can be selected to be at least 10 μm, and larger distances can be used.

The insulating material 170 can also extend in part over the semiconductor mesa 140 in the first region 120, and the insulating material 171 can also extend in part over the semiconductor mesa 141 in the second region 121. As shown in FIG. 1, the insulating material 170 can extend the distance B" over the semiconductor mesa 140. The insulating material 170 can extend a similar distance over the semiconductor mesa 141. The distance "B" can be selected at between 5 and 20 μm, for example, although "B" can be smaller (and even zero) or larger distances in other cases.

The insulating materials 170 and 171 can be formed as electrically-insulating oxides, nitrides, or combinations thereof. The insulating materials 170 and 171 can also be embodied as a glass or other dielectric material that is electrically insulating. The glass or other dielectric material can also exhibit low loss for RF fields that penetrate into it. For example, a loss tangent of the insulating materials 170 and 171 can be as low as 0.002 at 10 GHz. In some cases, the loss tangent of the insulating materials 170 and 171 can be between 0.0001 and 0.0004 in a frequency range between 500 MHz and 10 GHz. If it includes glass, the integrated circuit 10 can be considered an HMIC device. One benefit of an HMIC device is that passive circuit components can be formed entirely, or at least in part, over the insulating materials 170 and 171 in the region 122, because the glass can support the components.

Thus, electromagnetic radiation from any passive circuit components formed in the region 122 is distanced from parasitic conductive layers in the integrated circuit 10. This is because the interface between the semiconductor islands 130 and 131 and the semiconductor mesas 140 and 141, where parasitic conductive layers can occur, is physically and structurally interrupted by the insulating materials 170 and 171 in the region 122. Thus, the capacitors 150 and 151 and the inductors 160 and 161, for example, can be formed over the insulating materials 170 and 171 in the region 122, and those components are not formed over a parasitic conductive layer in the integrated circuit 10.

Other benefits of the insulating materials 170 and 171 include improved electrical isolation between the active devices 110 and 111, lower permittivity compared to other semiconductor materials, and structural support for passive circuit components. A transparent insulating material, such as glass, can also provide optical visibility through the wafer on which the integrated circuit 10 is fabricated. Through-wafer optical visibility can facilitate backside alignment for patterning structures on a backside of the integrated circuit 10.

The use of glass, which is a true dielectric, for the insulating materials 170 and 171, enables low-loss, high-Q reactive inductor and capacitor components to be monolithically incorporated with the GaN-on-silicon process technology used to form the active devices 110 and 111. The glass replaces the silicon substrate with a material having a low loss tangent for high frequency signals and a low dielectric constant. Inductors, capacitors, controlled-impedance 3D transmission lines, and other passive circuit components can be relied upon to provide matching and impedance transformation for high-power amplifiers and multistage MMIC integrated circuits. The insertion of glass between the active devices 110 and 111 removes the both the gallium nitride material, the silicon substrate, and also any parasitic conductive layer from under the passive circuit components, which minimizes effects that are degenerative to matching and impedance transformation.

Figure 2:
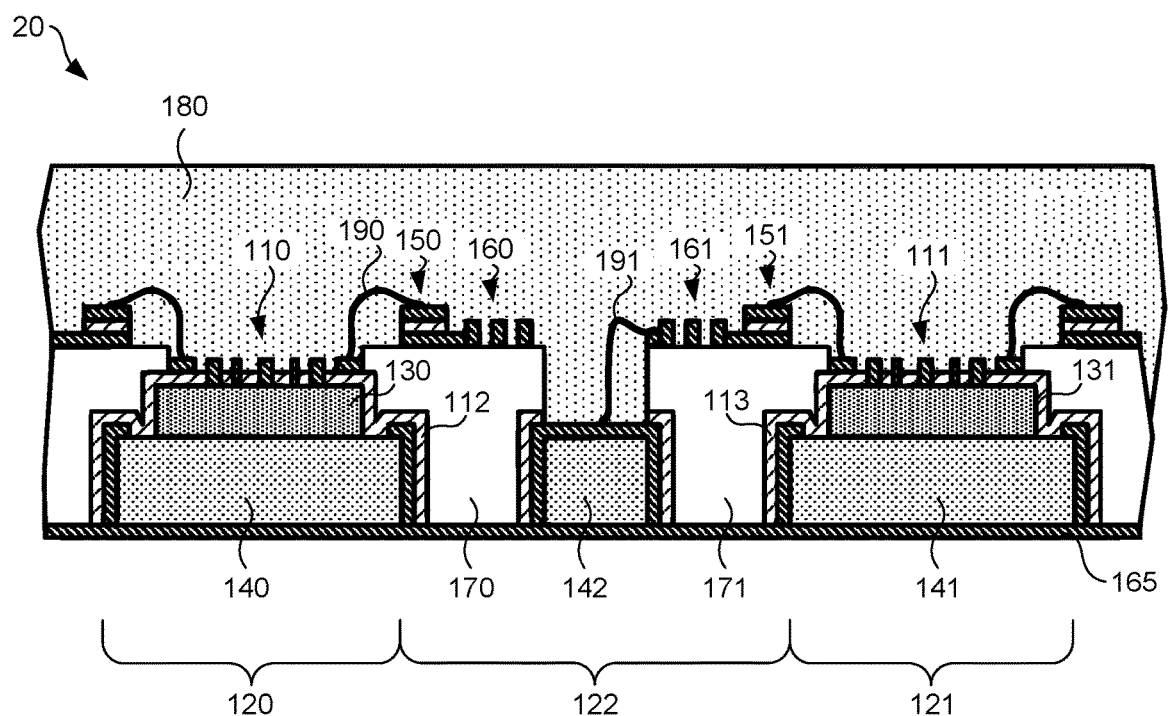
FIG. 2 illustrates a portion of another example integrated circuit according to various examples described herein.

FIG. 2 depicts a portion of another example integrated circuit 20 according to various examples described herein. The integrated circuit 20 is similar to the integrated circuit 10 shown in FIG. 1, but also includes bond wires in place of metal interconnects in some cases. For example, the integrated circuit 20 includes the bond wire 190, to electrically couple the active device 110 to the capacitor 150. The integrated circuit 20 also includes the bond wire 191 to electrically couple the inductor 161 to the ground plane 165. The integrated circuit 20 can incorporate additional bond wires between active and passive components, as shown in FIG. 1. The integrated circuit 20 can also incorporate one or more bond pads for landing bond wires, including the bond wires 190 and 191, for electrical connections among components. Any suitable type and number of bond wires can be used, such as gold bond wires of 1.5 mils in thickness.

FIGS. 3-1 to 3-10 illustrate several steps in an example method of manufacturing an integrated circuit, according to the concepts described herein. Although the integrated circuit 10, as shown in FIG. 1, is described as one example, similar steps can be relied upon to manufacture other integrated circuits according to the concepts described herein. In some cases, one or more of the steps described below can be omitted. Also, one or more of the steps can be performed concurrently, or in an order or sequence which differs from that described and illustrated.

Turning to FIG. 3-1, the process includes providing a base semiconductor substrate 300, such as a semiconductor wafer. The base semiconductor substrate 300 can be embodied as a bulk semiconductor substrate, such as a silicon substrate, which can be doped for n-type or p-type conductivity, or the semiconductor substrate can be an intrinsic semiconductor substrate. In some cases, an entire semiconductor substrate 300 can be doped when grown. In other cases, the process can include doping an upper region of the semiconductor substrate 300 using any suitable processing step (e.g., by ion implantation or epitaxial growth), to obtain a doping density desired for subsequent fabrication of semiconductor devices. In some embodiments, a doping density of the semiconductor substrate 300 near the process surface can be between $10^{15}$ cm$^{-3}$ and $10^{21}$ cm$^{-3}$, although other doping densities can be relied upon. In a more particular example, a doping density of the semiconductor substrate 300 near the process surface can be at least $5 \times 10^{18}$ cm$^{-3}$, to mitigate the effects associated with parasitic conductance and parasitic currents, although it may not be possible to completely eliminate the parasitic conductance layer. In other cases, the semiconductor substrate 300 can be a substrate of silicon carbide (SiC).

Also referring to FIG. 3-1, the process can include forming a semiconductor layer 310 over the semiconductor substrate 300. The semiconductor layer 310 can be formed by epitaxial growth over the semiconductor substrate 300, according to one example, although the semiconductor layer 310 can be formed using other suitable process techniques. In some cases, the semiconductor layer 310 can be formed from a same semiconductor material as the semiconductor substrate 300 (e.g., from silicon). However, in other cases, a different material may be used to form the semiconductor layer 310, such as gallium nitride material. The semiconductor layer 310 can have a thickness "T" of any value in a range from 1.5 μm to 50 μm, though other thicknesses may be used in some cases. Although not shown in FIG. 3-1, the process can also include forming one or more buffer layers, transition layers, diffusion barrier layers, and other layers between the semiconductor substrate 300 and the semiconductor layer 310.

The process includes covering one or more regions of the semiconductor layer 310 with a hard mask 302, and patterning the hard mask 302. The hard mask 302 can be patterned to form any number of islands, and two islands are depicted in FIG. 3-1. The hard mask 302 can be an oxide or a nitride, among other suitable materials. In some cases, a thermal oxide can be formed on the semiconductor layer 310, and the oxide can be subsequently patterned using lithographic processes to form the islands of the hard mask 302. In alternative embodiments, an oxide or nitride layer can be deposited by electron-beam evaporation, plasma deposition, atomic layer deposition, or chemical vapor deposition. An example thickness of the hard mask 302 can be between 200 nanometers (nm) and 2 μm.

As shown in FIG. 3-2, after forming the hard mask 302, the process can include etching away the semiconductor layer 310, particularly in the regions outside the hard mask 302. In that way, the first semiconductor island 130 and the second semiconductor island 131 can be isolated. The process can include etching by reactive-ion etching (RIE), as one example, although other etching techniques can be relied upon. In some cases, the etching process can be an anisotropic etching process. Most or all of the semiconductor layer 310 may be removed in the exposed regions outside the hard mask 302. For the example shown in FIG. 3-2, all of the semiconductor layer 310 in the exposed regions has been removed, leaving the semiconductor islands 130 and 131 under the hard mask 302. In a subsequent process step, the hard mask 302 can be removed using a wet or dry etching process.

As shown in FIG. 3-3, the process can include another masking and etching procedure to produce the structure shown in FIG. 3-3. For example, another hard mask or resist can be formed over the semiconductor substrate 300 and the semiconductor islands 130 and 131. The hard mask can be patterned to expose regions of the semiconductor substrate 300 between and around the semiconductor islands 130 and 131. A suitable etching process, such as deep reactive ion etching (DRIE), can be performed to remove at least some areas of the semiconductor substrate 300 in the region 122, creating relatively deep cavities 305 as shown in FIG. 3-3. As another example, an inductively coupled plasma (ICP) etching process can be used to etch the deep cavities 305.

According to some embodiments, the cavities 305 can extend down from a top surface of the semiconductor substrate 300 (also from the bottom surfaces of the semiconductor islands 130 and 131), into the semiconductor substrate 300. The cavities 305 can extend to a depth in a range from 100 μm to 200 μm. In some embodiments, the cavities 305 can extend down to any value in a range from 5 microns to 200 microns from a top surface of the semiconductor substrate 300.

In some cases, the hard mask or resist can be patterned to protect a region of the semiconductor substrate 300, so that the semiconductor pedestal 142 remains. The semiconductor pedestal 142 can be relied upon to provide a structure for a via, to provide a conductive path from a process side of the integrated circuit 10 to a backside of the integrated circuit 10. The deep cavities 305 can provide receptacles into which insulating material is formed.

Figures 3, 4:
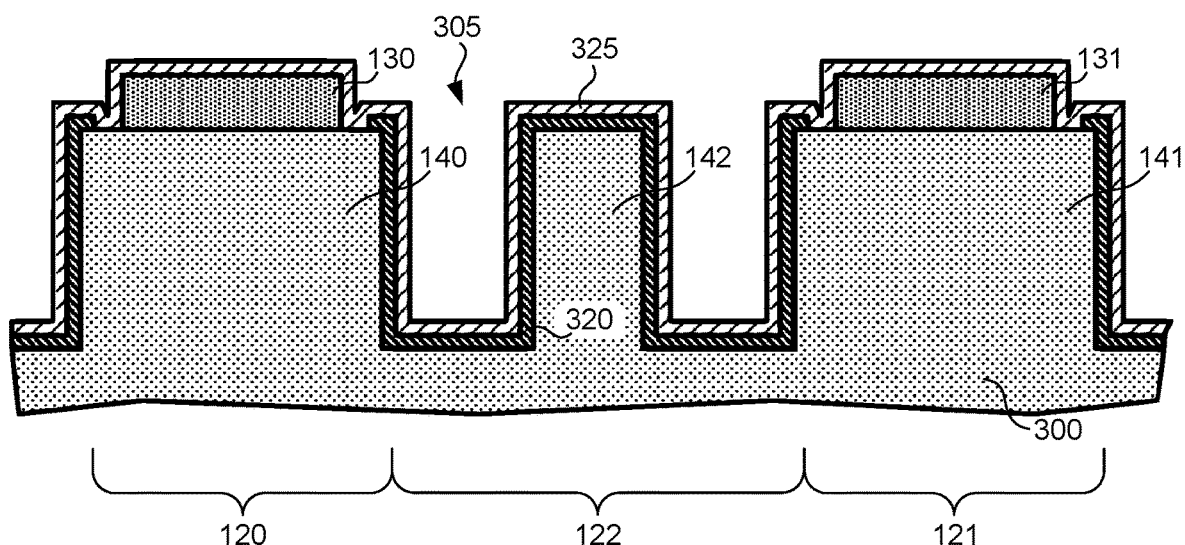

Referring to FIG. 3-4, the process also includes depositing a conductive film 320 over the entire semiconductor substrate 300, including the cavities 305, as well as the semiconductor islands 130 and 131. Subsequently, a resist can be patterned with openings over the semiconductor islands 130 and 131, so that the conductive film 320 in these regions can be etched away leaving the film structure shown in FIG. 3-4. Alternatively, a resist can be applied and patterned to mask the semiconductor islands 130 and 131, and the conductive film 320 can be deposited over exposed regions of the semiconductor substrate 300. The resist and part of the conductive film deposited on the resist can be removed using a lift-off process, leaving the conductive film 320, as shown in FIG. 3-4. In some cases, the conductive film 320 comprises cobalt silicide, though other conductive materials can be used alternatively or additionally. A thickness of the conductive film 320 may be any value in a range from 10 nm to 250 nm.

In some cases, the process also includes forming a dielectric film 325 over the entire semiconductor substrate 300, including the cavities 305, as depicted in FIG. 3-4. For example, an oxide or nitride film can be deposited conformally over the structure by plasma-enhanced chemical vapor deposition (PECVD) or atomic layer deposition (ALD). The dielectric film 325 can help protect the conductive film 320 and the semiconductor islands 130 and 131 during subsequent processing steps, including when an insulating material is applied. An example thickness of the dielectric film 325 can be between 50 nm and 300 nm.

In some embodiments, multiple layers of protective dielectric films can be deposited on at different process temperatures. For example, the dielectric film 325 can include a nitride, aluminum oxide, other dielectric, or multilayer combination thereof, which can be deposited by any variety of low-temperature processes. A low-temperature process includes a process in which the substrate temperature does not exceed 300° C. Example low-temperature processes include electron-beam evaporation, sputtering, PECVD, and ALD processes.

The process can also include depositing one or more additional protective layers, such as a layer of silicon nitride, over the dielectric film 325. The additional protective layer can be deposited by low pressure chemical vapor deposition (LPCVD), or other suitable techniques. Silicon nitride can be deposited at temperatures as high as 800° C. and pressures between 150 millitorr and 250 millitorr. In embodiments, the hydrogen content of the dielectric film 325 and/or additional protective layers is controlled to be not more than 15% (stoichiometric ratio). In some cases, the hydrogen content of the dielectric film 325 and/or additional protective layers can be controlled to be not more than 10%. The additional protective layers can be beneficial in protecting the semiconductor islands 130 and 131, when an insulating material is applied in later process steps, which can require temperatures as high as 900° C. A thickness of the additional protective layers can be between 50 nm and 300 nm.

Figures 3, 4, 5:
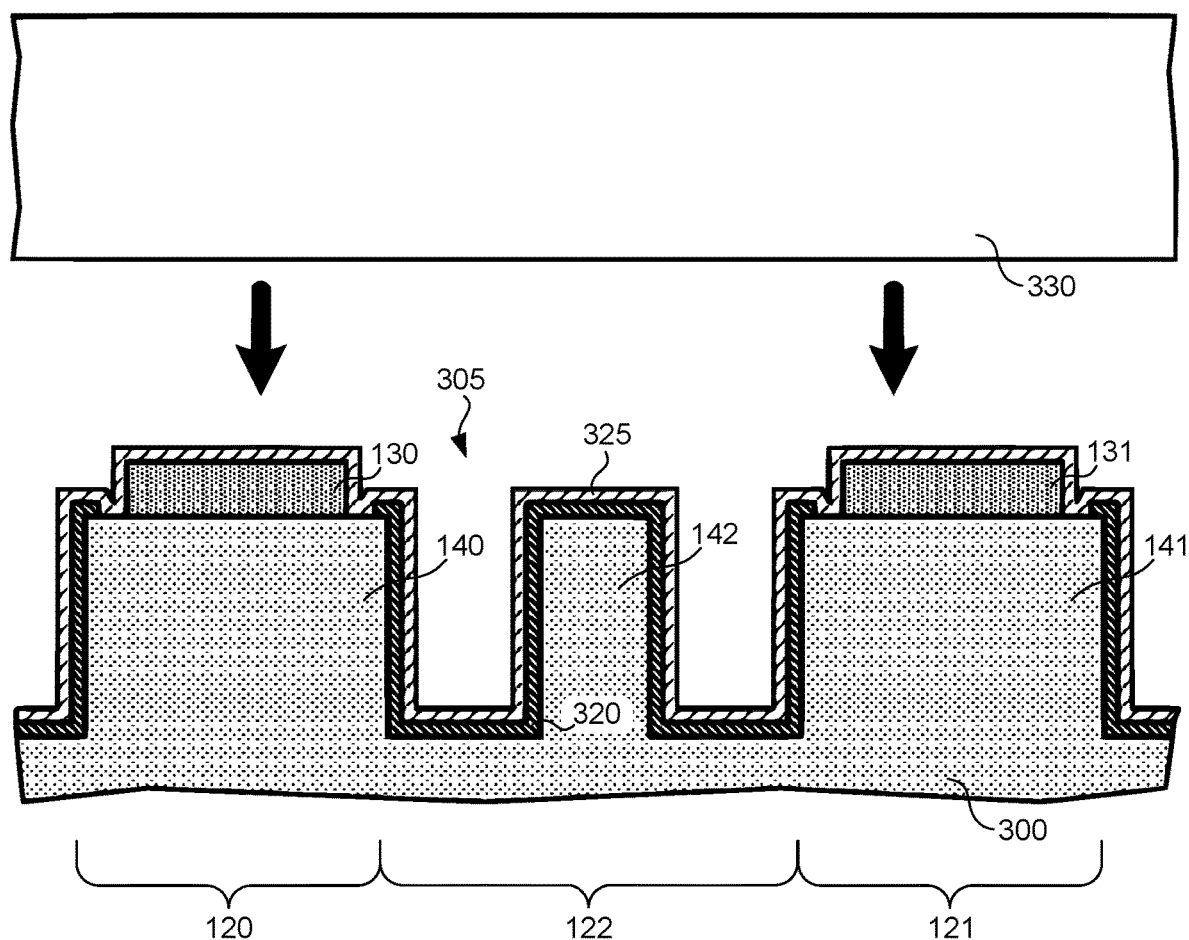
Figures 3, 4, 5, 6:
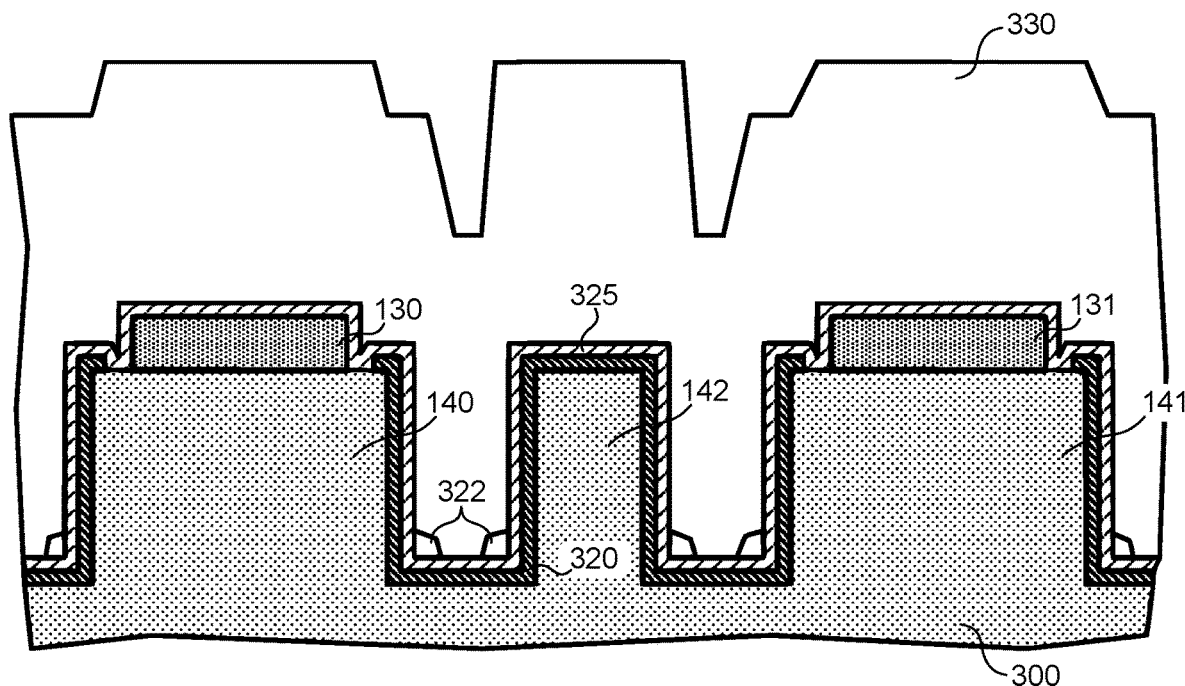
Figures 3, 4, 5, 6, 7:
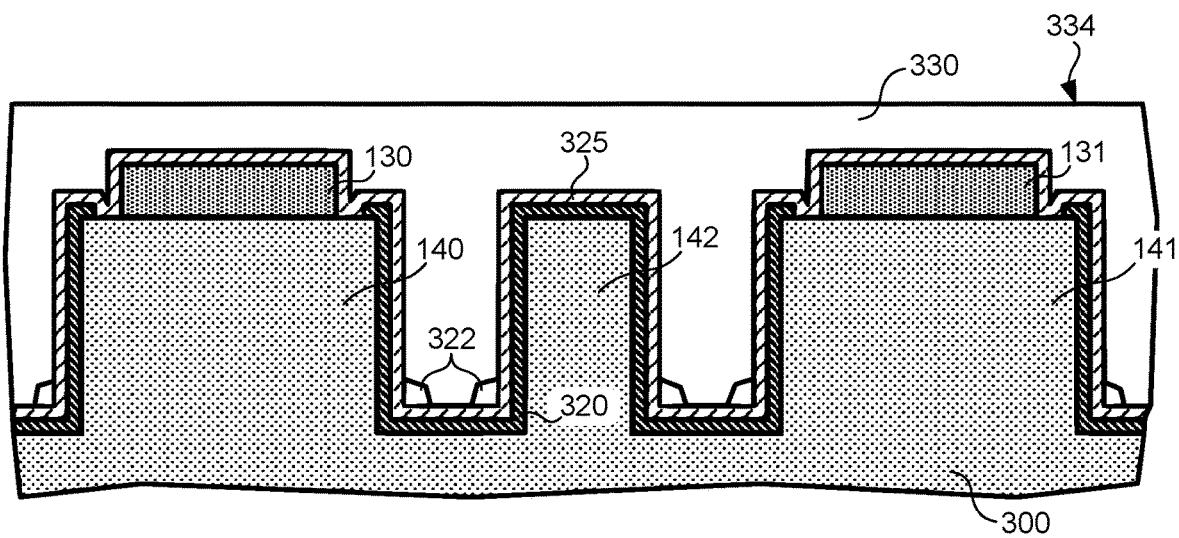
Figures 3, 4, 5, 6, 7, 8:
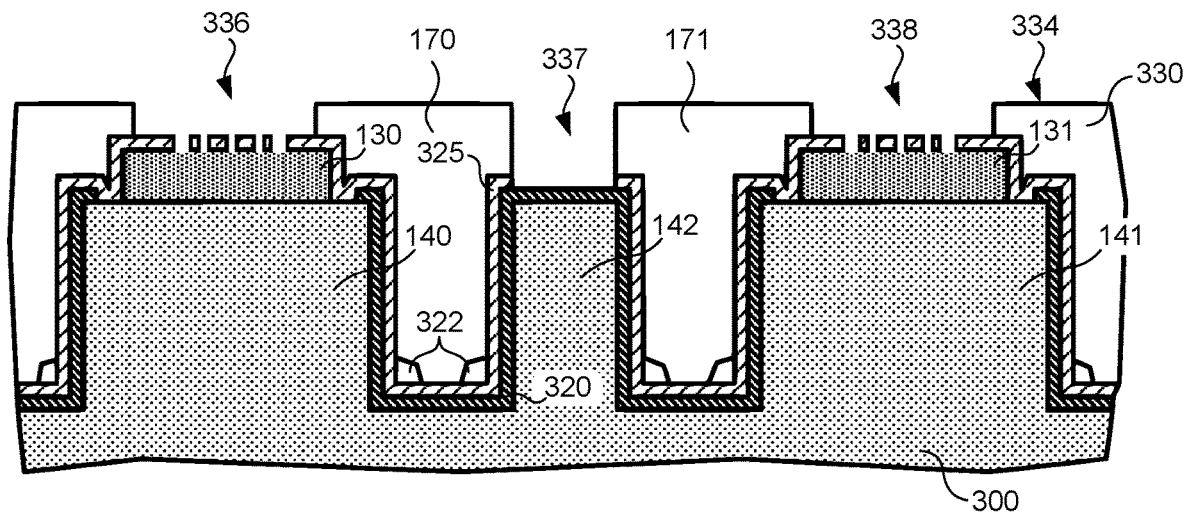
Figures 3, 4, 5, 6, 7, 8, 9:
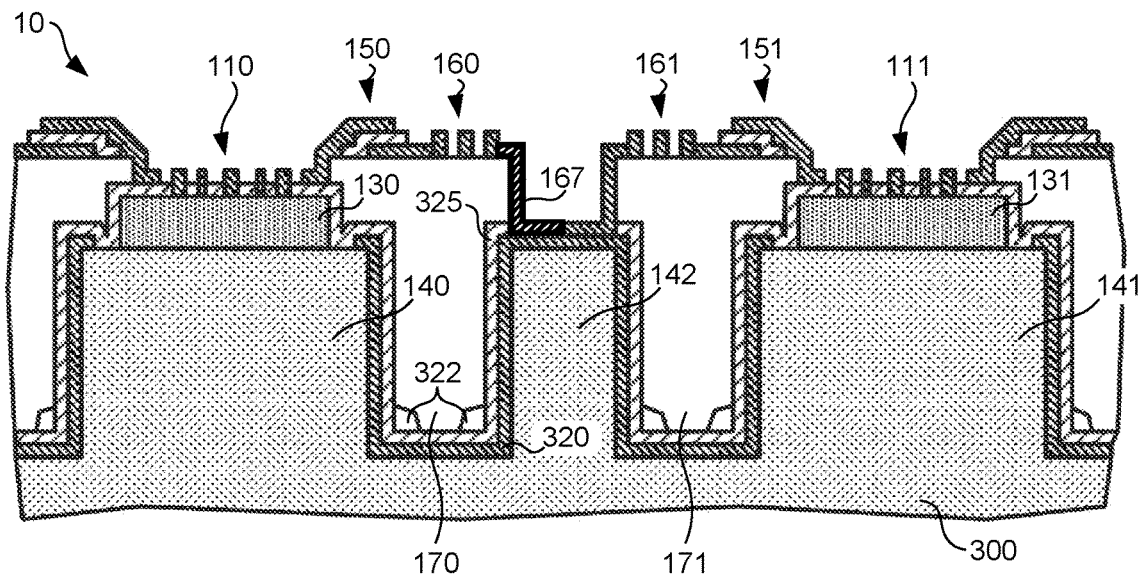
Figures 3, 4, 5, 6, 7, 8, 9, 10:
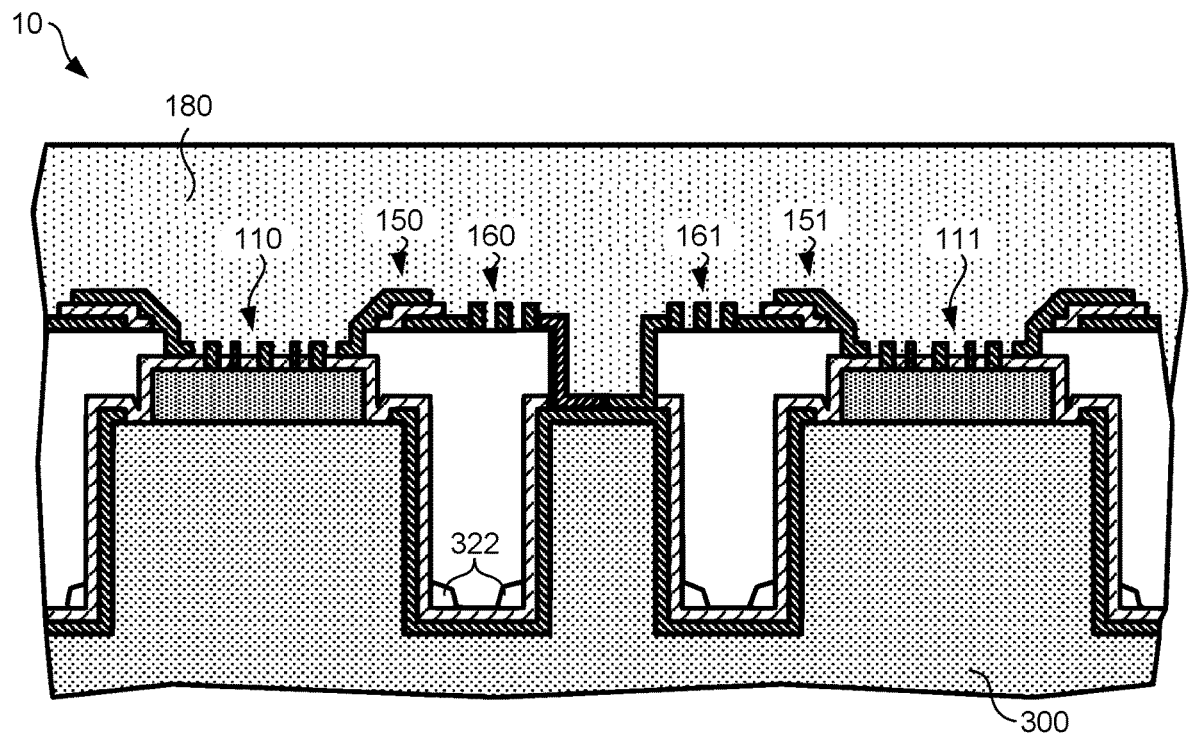
Figures 3, 4, 5, 6, 7, 8, 9, 10, 11:
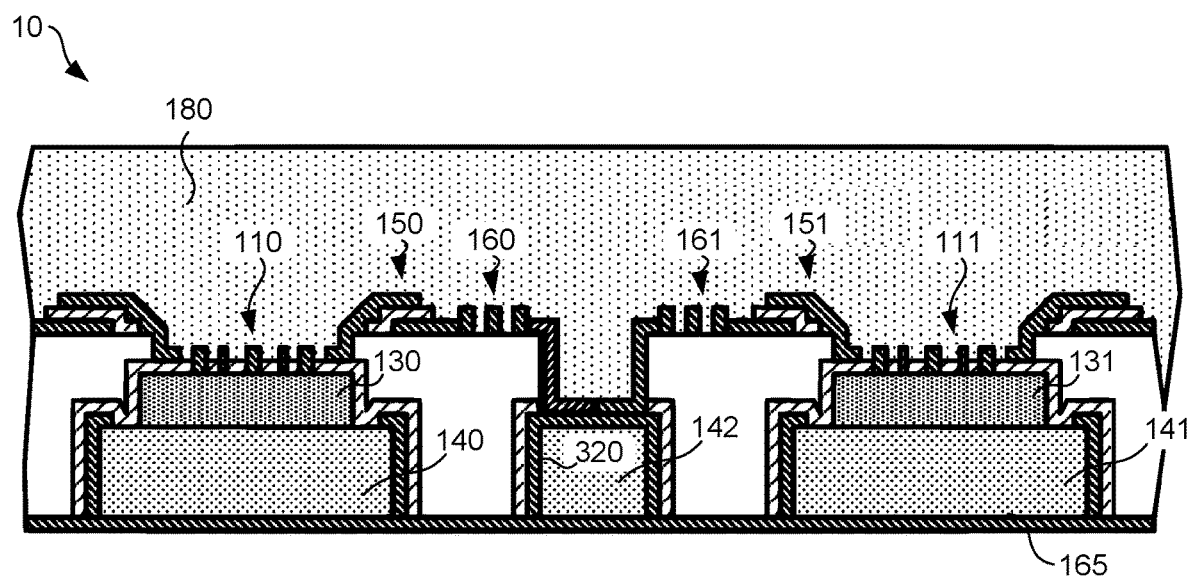

Turning to FIG. 3-5, the process includes depositing an insulating material 330 over the entire semiconductor substrate 300. In some cases, the insulating material 330 can be electrically-insulating oxides, nitrides, or combinations thereof. In the preferred example shown in FIG. 3-5, the insulating material 330 is a glass substrate. The glass substrate is allowed to soften, slump, and flow over the semiconductor substrate 300 at high temperature and low pressure, so that the glass reflows and fills the deep cavities 305, as depicted in FIG. 3-6. An example glass substrate that can be used is a Corning 7070 borosilicate glass, which can have a coefficient of thermal expansion that approximately matches the coefficient of thermal expansion for silicon. Other glasses can be used for other substrate materials. A thickness of the glass substrate can be between 250 microns and 750 microns.

A process of softening and flowing the insulating material 330 over the semiconductor substrate 300 can include placing the insulating material 330 and the semiconductor substrate 300 in slight contact with each other under vacuum between 10 millitorr and 50 millitorr. The process can also include heating the insulating material 330 and the semiconductor substrate 300 to a temperature of between 700° C. and 900° C., and allowing the insulating material 330 to reflow into the cavities 305 for a period of time. The process can also include applying pressure between 1 atmosphere and 3 atmosphere to the resulting structure, further forcing the insulating material 330 into the cavities 305, and then cooling the insulating material 330 and the semiconductor substrate 300 to a temperature below the transition temperature of the insulating material 330. A dry gas (e.g., nitrogen or argon) can be used to apply pressure to the electrically-insulating material 330, so that it does not absorb moisture. Although the insulating material 330 can fill most of the volume of the cavities 305, air pockets 332 can become trapped at the bottom of the cavities 305 in some cases, as depicted in FIG. 3-6.

Turning to FIG. 3-7, the process can include planarizing a top surface of the insulating material 330. The planarizing can include one or more of mechanical grinding, chemical grinding, and polishing steps, to form a planar surface 334 at a top of the insulating material 330 on the process side of the semiconductor substrate 300. The planar surface 334 can be suitable for subsequent lithographic and other microfabrication processes to be carried out on or over the planar surface 334.

Turning to FIG. 3-8, the process can include etching away the insulating material 330, the dielectric film 325, and any protective layers, to form openings 336-338, among others, in the insulating material 330. The insulating material 330 can be separated into the areas of insulating materials 170 and 171, as also shown in FIG. 1, by this process step. The dielectric film 325 can provide an etch stop that facilitates different etch depths for the openings 336 and 338, as compared to the opening 337, without impacting the materials under the dielectric film 325. In some cases, the etch depths of the openings 336 and 338 can vary by a factor of 2 or more as compared to the opening 337. Patterned resist, plasma etching, wet chemical etching, or other suitable techniques can be used to form the openings 336-338. In some cases, a weak anisotropic etch can be used so that sidewalls in the openings 336-338 of the insulating materials 170 and 171 are sloped outward from lower to higher (i.e., such that the top of the openings 336-338 are wider than the bottom), to facilitate patterning conductive interconnects along the sidewalls.

The insulating materials 170 and 171, among other areas of insulating material, can serve as an etch mask for the underlying layers. Additionally or alternatively, a resist used to pattern the insulating materials 170 and 171 can provide an etch mask for the underlying layers. One or more additional etching steps can be carried out to extend the openings 336-338 through the dielectric film 325 in some places, to expose areas of semiconductor material in the semiconductor islands 130 and 131. One or more etching steps can also be carried out to extend the openings 336-338 to or through the conductive film 320 in some places. In some cases, reactive ion etching can be used to etch through the underlying protective layers (e.g., dielectric film 325), to expose at least a portion of the underlying semiconductor islands 130 and 131, the conductive film 320, and/or semiconductor substrate 300.

The process also includes performing any number of lithographic and microfabrication process steps to form active devices and passive circuit components over the semiconductor substrate 300. FIG. 3-9 illustrates several examples of circuit elements that can be formed on the semiconductor substrate 300. Example elements include, but are not limited to, the active devices 110 and 111, the capacitors 150 and 151, the inductors 160 and 161, and metal interconnects 167. The interconnects 167 can run in any direction across a process side of the semiconductor substrate 300 and connect the circuit components together. In some cases, multiple levels of interconnects and conductive vias can be formed and relied upon to provide electrical connections between circuit components on multiple levels.

The active devices and passive circuit can be used at RF, and FIG. 3-9 is only a representative example of the components that can be formed. A wide variety of different active and passive circuit components, elements, and arrangements thereof can be formed.

At FIG. 3-10, the process includes encapsulating the active and passive circuit components with a passivation layer 180. The passivation layer 180 can include a polymer, such as but not limited to polyimide or benzocyclobutene. In some cases, an inorganic passivation layer can be used, such as but not limited to an oxide or nitride.

At FIG. 3-11, the process includes grinding and polishing a backside of the semiconductor substrate 300, to remove a portion of it. In some cases, the backside of the semiconductor substrate 300 can be removed to the extent necessary to remove the conductive film 320 at the bottom of the cavities 305 (see, e.g., FIG. 3-4), so that different regions in the integrated circuit 10 can be electrically isolated from each other. The amount of the semiconductor substrate 300 removed can be sufficient to extend into and remove the air pockets 322, as can be seen by a comparison between FIGS. 3-10 and FIGS. 3-11. In other cases, however, some of the semiconductor substrate 300 (and the air pockets 322) can remain below the cavities 305, such that the semiconductor mesas 140 and 141 and the semiconductor pedestal 142 are still connected along with the remaining semiconductor substrate 300 in the cross-sectional view shown in FIG. 3-11.

The process can also include depositing a conductive film, to form the ground plane 165, on at least a portion of the backside of the semiconductor substrate 300. The conductive film can provide a ground plane for RF circuitry. As one example, the ground plane 165 can include a titanium adhesion layer and gold film deposited by any suitable process step, such as electron-beam evaporation. Compositions other than titanium and gold can also be used for the ground plane 165. The ground plane 165 can be formed from one or more of nickel, tin, tungsten, chrome, aluminum, copper, or silver, as other examples. After backside, the semiconductor substrate 300 can be diced to form a plurality of dies.

A number of integrated circuit similar to the integrated circuit 10 can be formed in parallel across the semiconductor substrate 300, of which only a portion of one is shown in FIG. 3-11. For example, tens, hundreds, or thousands of additional active devices can be formed in parallel across the semiconductor substrate 300.

A die including the integrated circuit 10, among other semiconductor die, can be packaged in a suitable device package. FIGS. 4A and 4B depict one example of a package 400 that can be used to enclose a die including the integrated circuit 10, among others. The package 400 shown in FIGS. 4A and 4B can be suitable for an amplifier device. Other package shapes and form factors can be used for amplifiers and other devices. The die can be arranged with RF circuitry as an amplifier circuit for amplifying RF signals. In some embodiments, the die can be arranged as a Doherty amplifier, among other types of amplifiers.

The package 400 includes an enclosure 404 to surround or enclose the die including the integrated circuit 10. The enclosure 404 can be a ceramic or plastic enclosure, as examples. In some cases, the enclosure 404 can include a plastic or composite overmold enclosure. In some implementations, the package 400 can include a ceramic air-cavity or a plastic air-cavity, within which the integrated circuit 10 is mounted. The package 400 also includes terminals 411-413. The terminals 411-413 can be electrically coupled to the integrated circuit 10, such as to gate, drain, and source contacts of one or more of the active devices 110 and 111. In some cases, the terminals 411 and 413 can be shaped as fins. The conductive mount terminal 412 can be formed from one or more metals, such as aluminum, an aluminum alloy, copper, a copper alloy, though other metal compositions may be used. In addition to heat dissipation, the conductive mount terminal 412 can provide electrical connection to a reference potential, such as a ground potential. An end-on elevation view of the example package 400 is also depicted in FIG. 4B.

The active transistor devices described herein can include one or more field plates, such as source-connected field plates, gate-connected field plates, or both source-connected and gate-connected field plates. Although field-effect transistors (FETs) are described herein, the concepts described herein can be applied to bipolar junction transistors, insulated-gate bipolar transistors, diodes (e.g., photodiodes, Schottky diodes, and light-emitting and laser diodes, etc.), and other devices. Among other types of FETs, the transistors described herein can be formed as HEMTs, pseudomorphic high-electron mobility transistors (pHEMTs), and metamorphic high-electron mobility transistors (mHEMTs) for use as high efficiency power amplifiers.

The transistors described herein can be formed using a number of different semiconductor materials and semiconductor manufacturing processes. Example semiconductor materials include the group IV elemental semiconductor materials, including Silicon (Si) and Germanium (Ge), compounds thereof, and the group III elemental semiconductor materials, including Aluminum (Al), Gallium (Ga), and Indium (In), and compounds thereof. Semiconductor transistor amplifiers can be constructed from group III-V direct bandgap semiconductor technologies, in certain cases, as the higher bandgaps and electron mobility provided by those devices can lead to higher electron velocity and breakdown voltages, among other benefits. Thus, in some examples, the concepts can be applied to group III-V direct bandgap active semiconductor devices, such as the III-Nitrides (Aluminum (Al)-, Gallium (Ga)-, Indium (In)-, and their alloys (AlGaIn) based Nitrides), GaAs, InP, InGaP, AlGaAs, etc. devices. However, the principles and concepts can also be applied to transistors and other active devices formed from other semiconductor materials.

The concepts described herein can be embodied by GaN-on-Si transistors and devices, GaN-on-SiC transistors and devices, as well as other types of semiconductor materials. As used herein, the phrase "gallium nitride material," GaN material, or GaN semiconductor material refers to gallium nitride and any of its alloys, such as aluminum gallium nitride (Alx Ga(1-x) N), indium gallium nitride (Iny Ga (1-y) N), aluminum indium gallium nitride (Alx Iny Ga(1-x-y) N), gallium arsenide phosphide nitride (GaAsa Pb N(1-a-b)), aluminum indium gallium arsenide phosphide nitride (Alx Iny Ga(1-x-y) Asa Pb N(1-a-b)), among others. Typically, when present, arsenic and/or phosphorous are at low concentrations (e.g., less than 5 weight percent). The term "gallium nitride" or GaN semiconductor refers directly to gallium nitride, exclusive of its alloys.

The features, structures, or characteristics described above may be combined in one or more embodiments in any suitable manner, and the features discussed in the various embodiments are interchangeable, if possible. In the foregoing description, numerous specific details are provided in order to fully understand the embodiments of the present disclosure. However, a person skilled in the art will appreciate that the technical solution of the present disclosure may be practiced without one or more of the specific details, or other methods, components, materials, and the like may be employed. In other instances, well-known structures, materials, or operations are not shown or described in detail to avoid obscuring aspects of the present disclosure.

Although relative terms such as "on," "below," "upper," "lower," "top," "bottom," "right," and "left" may be used to describe the relative spatial relationships of certain structural features, these terms are used for convenience only, as a direction in the examples. It should be understood that if the device is turned upside down, the "upper" component will become a "lower" component. When a structure or feature is described as being "on" (or formed on) another structure or feature, the structure can be positioned directly on (i.e., contacting) the other structure, without any other structures or features intervening between the structure and the other structure. When a structure or feature is described as being "over" (or formed over) another structure or feature, the structure can be positioned over the other structure, with or without other structures or features intervening between them. When two components are described as being "coupled to" each other, the components can be electrically coupled to each other, with or without other components being electrically coupled and intervening between them. When two components are described as being "directly coupled to" each other, the components can be electrically coupled to each other, without other components being electrically coupled between them.

Terms such as "a," "an," "the," and "said" are used to indicate the presence of one or more elements and components. The terms "comprise," "include," "have," "contain," and their variants are used to be open ended and may include or encompass additional elements, components, etc., in addition to the listed elements, components, etc., unless otherwise specified. The terms "first," "second," etc. are used only as labels, rather than a limitation for a number of the objects.

Although embodiments have been described herein in detail, the descriptions are by way of example. The features of the embodiments described herein are representative and, in alternative embodiments, certain features and elements can be added or omitted. Additionally, modifications to aspects of the embodiments described herein can be made by those skilled in the art without departing from the spirit and scope of the present invention defined in the following claims, the scope of which are to be accorded the broadest interpretation so as to encompass modifications and equivalent structures.

The invention claimed is:

1. An integrated circuit comprising:
a first integrated device over a first semiconductor structure in a first region of the integrated circuit;
a second integrated device over a second semiconductor structure in a second region of the integrated circuit; and
a passive component over a third region of the integrated circuit, between the first region and the second region, wherein the first semiconductor structure and the second semiconductor structure comprise gallium nitride material over a semiconductor substrate and the third region comprises an insulating material.

2. The integrated circuit of claim 1, wherein:
the passive component comprises a network of passive components; and
the network of passive components comprises at least one capacitor and at least one inductor.

3. The integrated circuit of claim 1, wherein the passive component comprises a network of passive components for input and output impedance matching of the integrated circuit.

4. The integrated circuit of claim 1, wherein:
the first semiconductor structure comprises an island of gallium nitride material formed over the semiconductor substrate; and
the first integrated device is over the island of gallium nitride material.

5. The integrated circuit of claim 4, wherein, in the third region, the insulating material extends down into the semiconductor substrate to at least a distance below an interface between the island of gallium nitride material and the semiconductor substrate in the first region.

6. The integrated circuit of claim 4, wherein the semiconductor substrate comprises a semiconductor mesa of silicon.

7. The integrated circuit of claim 6, wherein, in the third region, the insulating material separates the first semiconductor structure from the second semiconductor structure.

8. The integrated circuit of claim 4, wherein:
the second semiconductor structure comprises an island of gallium nitride material over the semiconductor substrate; and
the second integrated device is over the island of gallium nitride material.

9. The integrated circuit of claim 1, wherein the insulating material comprises glass.

10. The integrated circuit of claim 9, wherein the passive component is over the glass.

11. The integrated circuit of claim 1, wherein the first integrated device and the second integrated device comprise high-electron-mobility transistors.

12. The integrated circuit of claim 1, wherein the first integrated device comprises a transistor, and the second integrated device comprises a diode.

13. The integrated circuit of claim 1, further comprising:
a ground plane on a back side of the integrated circuit below the first semiconductor structure and the second semiconductor structure; and
a passivation layer over the first integrated device, the second integrated device, and the passive component.

14. The integrated circuit of claim 13, further comprising:
a semiconductor pedestal in the third region, wherein the passive component is electrically coupled to the ground plane through an interconnect supported along at least one surface of the semiconductor pedestal.

15. The integrated circuit of claim 14, wherein:
the semiconductor pedestal is separated from the first semiconductor structure by the insulating material; and
the semiconductor pedestal is separated from the second semiconductor structure by the insulating material.

16. An integrated circuit comprising:
a first integrated device over a first semiconductor structure in a first region of the integrated circuit;
a second integrated device over a second semiconductor structure in a second region of the integrated circuit; and
a passive component over a third region of the integrated circuit, between the first region and the second region, wherein the first semiconductor structure and the second semiconductor structure comprise gallium nitride material over a semiconductor substrate and the third region comprises an insulating material, wherein:
in the third region, the insulating material extends down into the semiconductor substrate to at least a distance below an interface between the gallium nitride material and the semiconductor substrate in the first region and below an interface between the gallium nitride material and the semiconductor substrate in the second region.

17. The integrated circuit of claim 16, wherein:

the passive component comprises a network of passive components; and the network of passive components comprises at least one capacitor and at least one inductor.

18. The integrated circuit of claim 16, wherein the insulating material comprises glass.

19. The integrated circuit of claim 18, wherein the passive component is over the glass.

20. The integrated circuit of claim 16, wherein the first integrated device comprises a transistor, and the second integrated device comprises a diode.

* * * * *